US010050047B2

(12) United States Patent
Chuang et al.

(10) Patent No.: US 10,050,047 B2
(45) Date of Patent: Aug. 14, 2018

(54) METHOD TO IMPROVE FLOATING GATE UNIFORMITY FOR NON-VOLATILE MEMORY DEVICE

(71) Applicant: Taiwan Semiconductor Manufacturing Co., Ltd., Hsin-Chu (TW)

(72) Inventors: Harry-Hak-Lay Chuang, Zhubei (TW); Chin-Yi Huang, Hsin-Chu (TW); Ya-Chen Kao, Fuxing Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/489,287

(22) Filed: Apr. 17, 2017

(65) Prior Publication Data
US 2017/0221909 A1 Aug. 3, 2017

Related U.S. Application Data

(62) Division of application No. 14/609,575, filed on Jan. 30, 2015, now Pat. No. 9,627,392.

(51) Int. Cl.
*H01L 27/11507* (2017.01)
*H01L 21/3213* (2006.01)
(Continued)

(52) U.S. Cl.
CPC .. *H01L 27/11507* (2013.01); *H01L 21/28273* (2013.01); *H01L 21/32115* (2013.01);
(Continued)

(58) Field of Classification Search
CPC ......... H01L 27/11521; H01L 21/76224; H01L 27/11507; H01L 21/28273;
(Continued)

(56) References Cited

U.S. PATENT DOCUMENTS

| 6,872,667 | B1* | 3/2005 | Shieh | H01L 21/31116 257/E21.252 |
| 7,151,302 | B1* | 12/2006 | Chindalore | H01L 21/31053 257/127 |
| 2005/0056895 | A1* | 3/2005 | Shimizu | H01L 27/115 257/355 |
| 2006/0258076 | A1* | 11/2006 | Mizushima | H01L 21/76229 438/201 |

(Continued)

FOREIGN PATENT DOCUMENTS

CN 101051620 A 10/2007
CN 101236926 A 8/2008

OTHER PUBLICATIONS

Non-Final Office Action dated Jun. 23, 2016 for U.S. Appl. No. 14/609,575.
(Continued)

*Primary Examiner* — Cuong Q Nguyen
*Assistant Examiner* — Tong-Ho Kim
(74) *Attorney, Agent, or Firm* — Eschweiler & Potashnik, LLC

(57) ABSTRACT

The present disclosure relates a method for manufacturing an integrated circuit. In some embodiments, a semiconductor substrate is provided and made up of a memory array region and a boundary region surrounding the memory array region. A hard mask layer is formed over the memory array region and the boundary region. The hard mask layer is patterned to form a boundary hard mask having one or more slots to expose some portions of the boundary region while the remaining regions of the boundary region are covered by the boundary hard mask. A floating gate layer is formed within the memory array region and extending over the hard mask layer. Then, a planarization is performed to reduce a height of the floating gate layer and form a plurality of floating gates.

20 Claims, 14 Drawing Sheets

(51) Int. Cl.
*H01L 29/06* (2006.01)
*H01L 29/66* (2006.01)
*H01L 27/11521* (2017.01)
*H01L 21/28* (2006.01)
*H01L 21/321* (2006.01)

(52) U.S. Cl.
CPC .. *H01L 21/32139* (2013.01); *H01L 27/11521* (2013.01); *H01L 29/0649* (2013.01); *H01L 29/66825* (2013.01)

(58) Field of Classification Search
CPC ......... H01L 21/32115; H01L 21/32139; H01L 29/0649; H01L 29/66825
USPC .......................................... 257/316; 438/424
See application file for complete search history.

(56) References Cited

U.S. PATENT DOCUMENTS

2006/0289946 A1 12/2006 Chindalore
2007/0128804 A1* 6/2007 Jin .................... H01L 27/115
438/258
2008/0265304 A1* 10/2008 Lee .................. H01L 21/28273
257/316

OTHER PUBLICATIONS

Notice of Allowance dated Dec. 8, 2016 for U.S. Appl. No. 14/609,575.

* cited by examiner

METHOD TO IMPROVE FLOATING GATE UNIFORMITY FOR NON-VOLATILE MEMORY DEVICE

REFERENCE TO RELATED APPLICATION

This Application is a Divisional of U.S. application Ser. No. 14/609,575 filed on Jan. 30, 2015, the contents of which are hereby incorporated by reference in their entirety.

BACKGROUND

Flash memory is an electronic non-volatile computer storage medium that can be electrically erased and re-programmed. To store information, flash memory includes an addressable array of memory cells; each of which includes a transistor with a floating gate disposed over a substrate separated therefrom by an insulating dielectric layer. As the size of on-chip components is scaled (i.e., reduced), device "shrinkage" allows engineers to integrate more components and more corresponding functionality onto newer generations of ICs. In recent technology nodes, this has allowed for flash memory to be embedded on an integrated chip with logic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
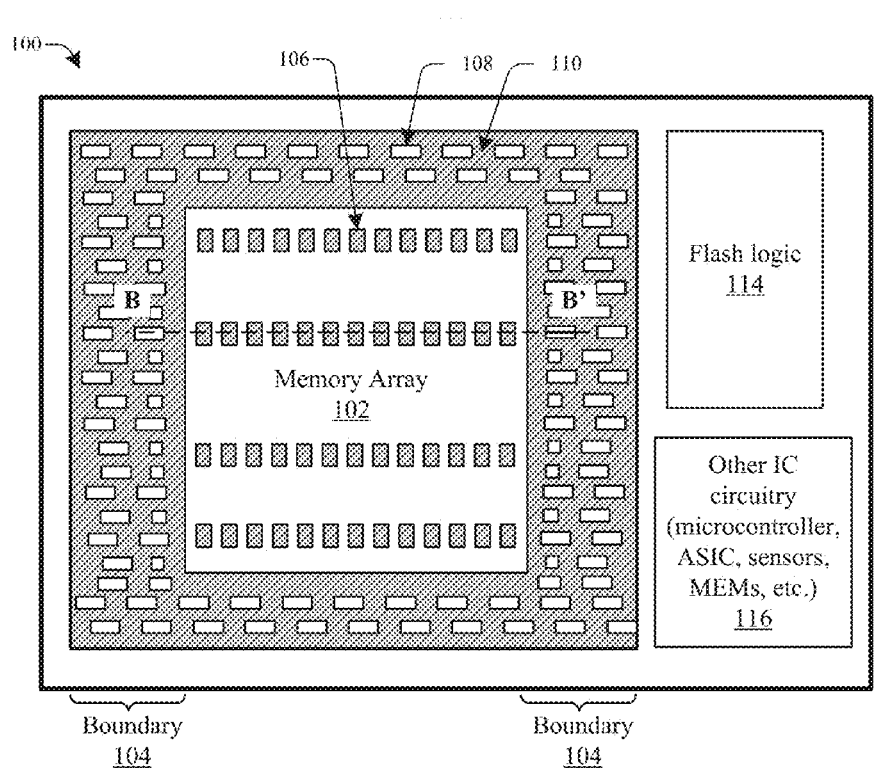
FIG. 1 illustrates a structural view of some embodiments of an integrated circuit (IC) having a memory array region and a surrounding boundary region.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A trend in semiconductor manufacturing is to integrate different devices, such as a memory and a logic circuit, on a single substrate. The fabrication process of these embedded integrate circuits (ICs) may include a series of planarization processes. For example, memory gate structures of an embedded flash memory IC can be formed by depositing a self-aligned conductive layer, followed by a chemical-mechanical polishing (CMP) process that planarizes a top surface of the conductive layer to form floating gate structures. In such manufacturing processes, the CMP process may not result in a planar surface as expected. This is partially because the CMP process removes different materials at different rates, resulting in surface anomalies. For example, a hard mask layer is more "resistive" to the planarization chemicals and is used as a stop layer of the planarization process, covering a boundary region surrounding the memory array region. Portions of the conductive layer closer to the boundary region will end up being thicker than at a center region of the memory array region, thereby resulting in thicker floating gate structures near the boundary region and thinner floating gate structures in the center region of the memory array region.

The non-uniformity of the conductive layer (i.e., the reduced thickness of the floating gates at the center region relative to other regions) may result in performance degradation and less reliability. Accordingly, the present disclosure relates to a new integrated circuit (IC) structure, and associated processing methods, that improves uniformity within a memory array region. Approaches include adding dummy patterns at the memory array region and/or adding dummy "slots" at the boundary region when forming a hard mask layer before forming floating gate material. The hard mask layer is used as a planarization stopping layer. Different from previous approaches, wherein the hard mask layer is patterned to open the memory array region and cover the other regions of the IC for forming floating gates at the memory array region, the current approaches use the dummy patterns and dummy slots of the hard mask layer to balance etching rates at the memory array center and edge during the planarization process and thus result in more uniform thickness of the floating gates. In some embodiments, a semiconductor substrate is provided and made up of a memory array region and a boundary region surrounding the memory array region. A hard mask layer is formed over the memory array region and the boundary region. The hard mask layer is patterned to form a boundary hard mask having one or more slots to expose some portions of the boundary region while the remaining regions of the boundary region are covered by the boundary hard mask. A floating gate layer is formed within the memory array region and extending over the hard mask layer. Then, a planarization is performed to reduce a height of the floating gate layer and form a plurality of floating gates.

FIG. 1 shows a structural view of an integrated circuit (IC) 100 having a memory array region 102 and a boundary region 104 according to some embodiments. The boundary region 104 surrounds the memory array region 102 and separates the memory array region 102 from other components of the IC 100, for example, a flash logic region 114 or other circuitry 116, such as microcontrollers, application-specific integrated circuits, sensors, micro-electromechanical systems, or other components that are applicable to be integrated. A dummy pattern hard mask 106 is disposed at the memory array region 102 comprising a plurality of discrete portions. In some embodiments, the boundary region 104 is covered by a boundary hard mask 110, which includes one or more holes or slots 108 therein. The dummy pattern hard mask 106 and the boundary hard mask 110 are made of same material. During a subsequent planarization process, a conductive layer is firstly formed on exposed portions of the memory array region 102 not covered by the dummy pattern hard mask 106, and cover the dummy pattern hard mask 106 and the boundary hard mask 110. The dummy pattern hard mask 106 and the boundary hard mask 110 are configured as an etch stopping layer for the planarization process, and the dummy pattern hard mask 106 and the slots 108 provide a balanced support for the memory array region 102 and the boundary region 104 and other regions. Thus, the dummy pattern mask 106 and boundary hard mask 110 prevents "dishing" effect of features in memory array region 102 during CMP operations, for example. Notably, some portions of the dummy pattern hard mask 106 and the boundary hard mask 110 may be at least partially removed during the subsequent manufacturing process.

Figure 2:
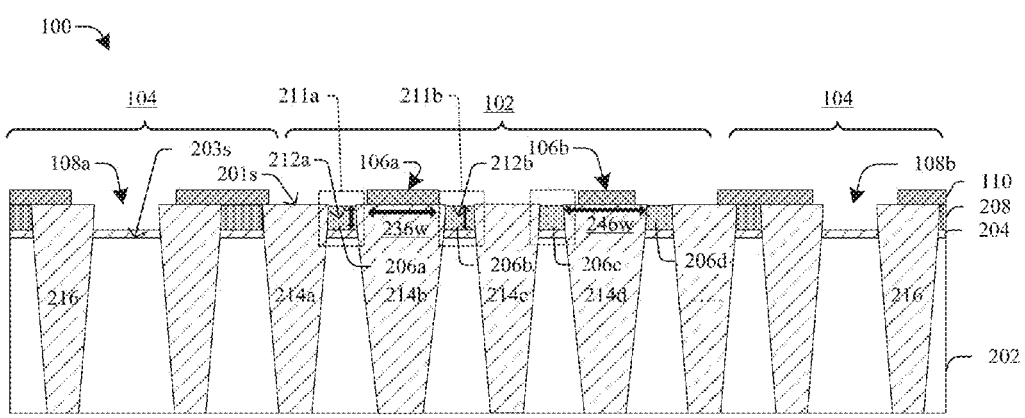
FIG. 2 illustrates a cross-sectional view of some embodiments of an integrated circuit (IC) having a plurality of floating gates with a substantially uniform thickness.

FIG. 2 shows some embodiments of a cross-sectional view of the integrated circuit (IC) 100 of FIG. 1 taken along cross-sectional line B-B'. The IC 100 comprises a semiconductor substrate 202 made up of a memory array region 102 and a boundary region 104 surrounding the memory array region 102. As shown, the memory array region 102 can comprise a plurality of flash memory cells 211 (e.g. 211a, 211b . . . ) disposed over the semiconductor substrate 202, and laterally separated by a plurality of shallow trench isolations (STI) regions 214 (such as 214a, 214b, 214c . . . ). The plurality of STI regions 214 have an upper surface 201s that is higher than a planar upper surface 203s of the semiconductor substrate 202. In some embodiments, a plurality of floating gates 206 are respectively disposed between neighboring STI regions 214 (e.g. a floating gate 206b is disposed between a first STI region 214b and a second STI region 214c). Due to manufacturing methods to be disclosed below, the floating gates 206 have a substantially uniform thickness from a center to an edge of the memory array region 102. For example, a first floating gate 206a at the edge of the memory array region 102 has a first thickness 212a that is substantially same with a second thickness 212b of a second floating gate 206b that being closer to the center of the memory array region 102 (while the first thickness 212a may be greater than the second thickness 212b in the previous approaches because of planarization non-uniformity). In some embodiments, a plurality of dielectrics 216 are disposed at the boundary region 104 within the semiconductor substrate 202. The dielectrics 216 can extend out of the upper surface 203s of the semiconductor substrate 202. The dielectrics 216 have an upper surface that is aligned with the upper surface 201s of the STI regions.

A dummy pattern hard mask 106 is disposed at some of the STI regions 214 discretely configured to provide more support for the memory array region 102 during the planarization. In some embodiments, the dummy pattern hard mask 106 may comprise silicon dioxide or silicon nitride. While the rest region of the boundary region 104 is covered by a boundary hard mask 110, a slot 108 is disposed at the boundary region 104 to provide balance and etch stopping function. The dummy pattern hard mask 106 is disposed at some selected STI regions. For example, a first portion 106a of the dummy pattern hard mask 106 is disposed on the first STI region 214b; while no dummy pattern hard mask is disposed on the second STI region 214c; and a second portion 106b of the dummy pattern hard mask 106 is disposed on a third STI region 214d. An upper surface of the plurality of floating gates 206 is horizontally lower than that of the dummy pattern hard mask 106. In some embodiments, portions of the dummy pattern hard mask 106 can respectively have a dimension 236w that is greater than about 100 nm. The dummy pattern hard mask 106 has a thickness in a range of from about 100 Å to about 300 Å. A distance from a dummy pattern hard mask 106 to a nearest edge of the STI region 214 underneath may be larger than about 65 nm and can range from for example from 40 nm to 200 nm in some embodiments. The STI regions that have the dummy pattern hard mask disposed thereon (e.g. 214b, 214d) should have an area that is large enough to keep dummy pattern hard mask from stripping off unwantedly during the planarization process. For example, the above STI regions can have length and width 246w greater than around 200 nm. Although the dummy pattern hard mask and the boundary hard mask are shown in FIG. 2, it could be removed partially or entirely during the subsequent manufacturing process.

Although the dummy pattern hard mask 106 and corresponding STI regions 214 of FIG. 2 are described as having dimensions set forth above, it will be appreciated that such dimension values are non-limiting examples. For example, as the size of an integrated chip scales, the stated width and depth values may also scale accordingly (i.e., the dimension given for the dummy pattern hard mask and corresponding STI regions described in relation to FIG. 2 are for 40 nm process node, but may scale for different process nodes, such as 28 nm, 22 nm, 14 nm, 10 nm, etc.).

Figure 3A:
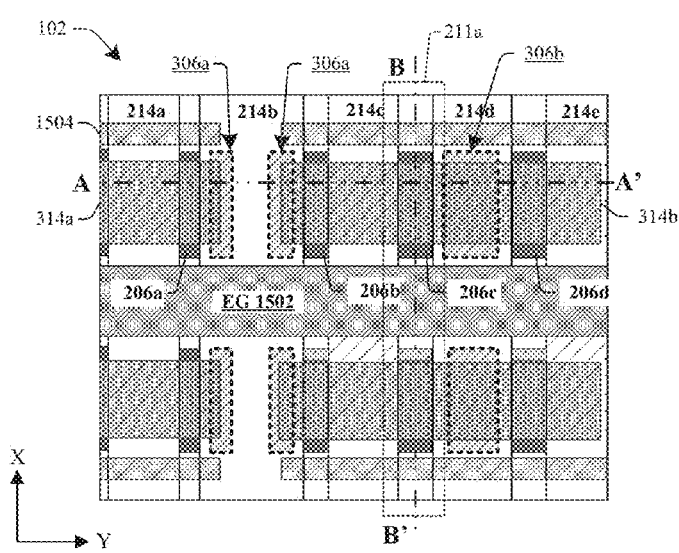
FIG. 3A illustrates a top view of some embodiments of a memory array region of an integrated circuit (IC) having a hard mask disposed under a control gate layer.
Figure 3B:
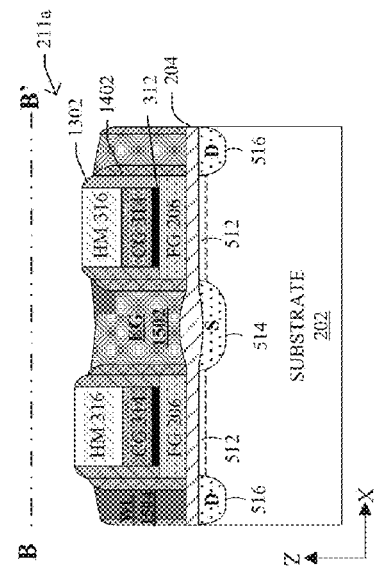
FIG. 3B illustrates a cross-sectional view of some other embodiments of a memory array region of an integrated circuit (IC) along a line B-B' of FIG. 3A.
Figure 3C:
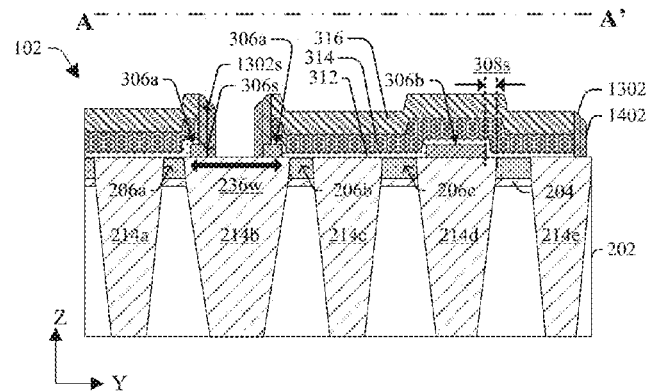
FIG. 3C illustrates a cross-sectional view of some other embodiments of a memory array region of an integrated circuit (IC) along a line A-A' of FIG. 3A.

FIG. 3A-FIG. 3C show some more details of a memory array region 102 of the integrated circuit (IC) according to some embodiments. As shown, a plurality of floating gates 206 are disposed filling recesses between upper portions of neighboring STI regions 214. In some embodiments, a first hard mask 306a is disposed on a first STI region 214b and a second hard mask 306b is disposed on a second STI region 214d. A control gate layer 314 (e.g. 314b) is disposed over a plurality of floating gates 206 (e.g. 206b, 206c, 206d), separated from the floating gates 206 by a control dielectric layer 312. The control dielectric layer 312 and the control gate layer 314 step upwards to extend over an edge of the hard masks 306. In some embodiments, a control gate spacer 1302 is disposed along a sidewall of the control gate layer 314 and a floating gate spacer 1402 is disposed along a sidewall of the floating gate 206 and the control gate spacer 1302. In some embodiments, as shown in the top view of FIG. 3A and the cross-sectional view of FIG. 3C, the first hard mask 306a can be disposed at an edge of a "word", or an unit of the memory array region 102. If this is the case, the control gate spacer 1302 may stop on the first hard mask 306a. An outer sidewall 306s of the first hard mask 306a can be aligned with an outer sidewall 1302s of the control gate spacer 1302. The floating gate spacer 1402 can extend downwardly to cover outer sidewalls of the floating gate 206 (as shown in FIG. 3B) and the first hard mask 306a (as shown in FIG. 3C).

FIG. 3B shows some embodiments of a cross-sectional view of a pair of split gate flash memory cells (e.g., memory cell pair 211a of FIG. 3A) along a perpendicular line B-B' of FIG. 3A. As shown, the memory cell pair 211a includes first and second memory cells that respectively comprises a drain region 516 and a source region 514 spaced apart by a channel region 512 in the x direction. The control gate layer 314 is capacitively coupled to the floating gate 206, which is separated by a control dielectric layer 312. A gate dielectric 204 is disposed between the floating gate 206 and the channel region 512. In some embodiments, a mask layer 316 can be disposed over the control gate 314. The control gate spacer 1302 covers sidewall of the control gate layer 314 and the floating gate spacer 1402 covers sidewall of the floating gates 206.

Figure 4A:
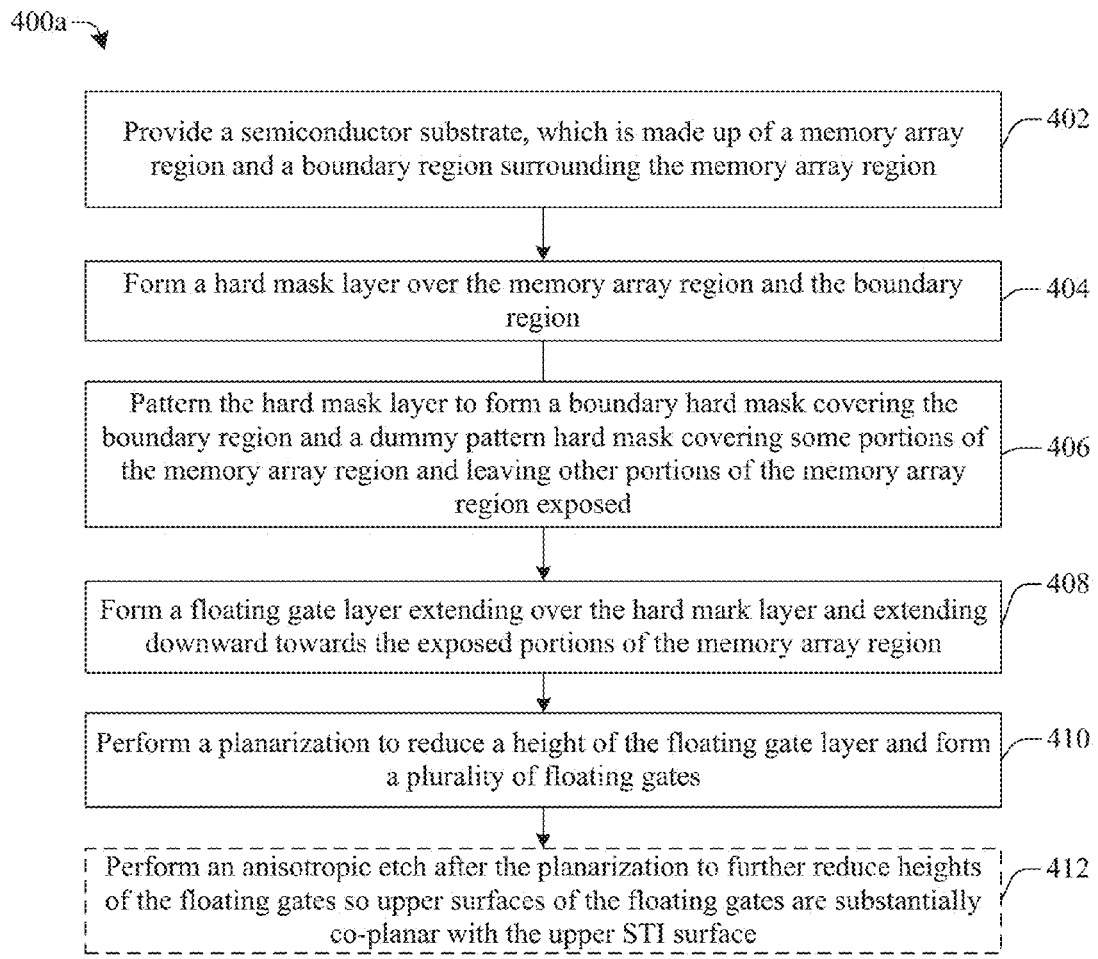
FIG. 4A illustrates a flow diagram of some embodiments of a method of forming an integrated circuit (IC) using a dummy pattern hard mask at the memory array region.

FIG. 4A shows a flow diagram of a method 400a of forming an integrated circuit (IC) using a dummy pattern hard mask at the memory array region in accordance with some embodiments. While the disclosed method 400a is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 402, a semiconductor substrate is provided, which is made up of a memory array region and a boundary region surrounding the memory array region.

At act 404, a hard mask layer is formed over the memory array region and the boundary region.

At act 406, the hard mask layer is patterned to form a boundary hard mask covering the boundary region and a dummy pattern hard mask covering some portions of the memory array region and leaving other portions of the memory array region exposed.

At act 408, a floating gate layer is formed extending over the hard mark layer and extending downward towards the exposed portions of the memory array region.

At act 410, a planarization is performed to reduce a height of the floating gate layer and form a plurality of floating gates.

At act 412, optionally, an anisotropic etch is performed after the planarization to further reduce heights of the floating gates so upper surfaces of the floating gates are substantially co-planar with the upper STI surface.

Figure 4B:
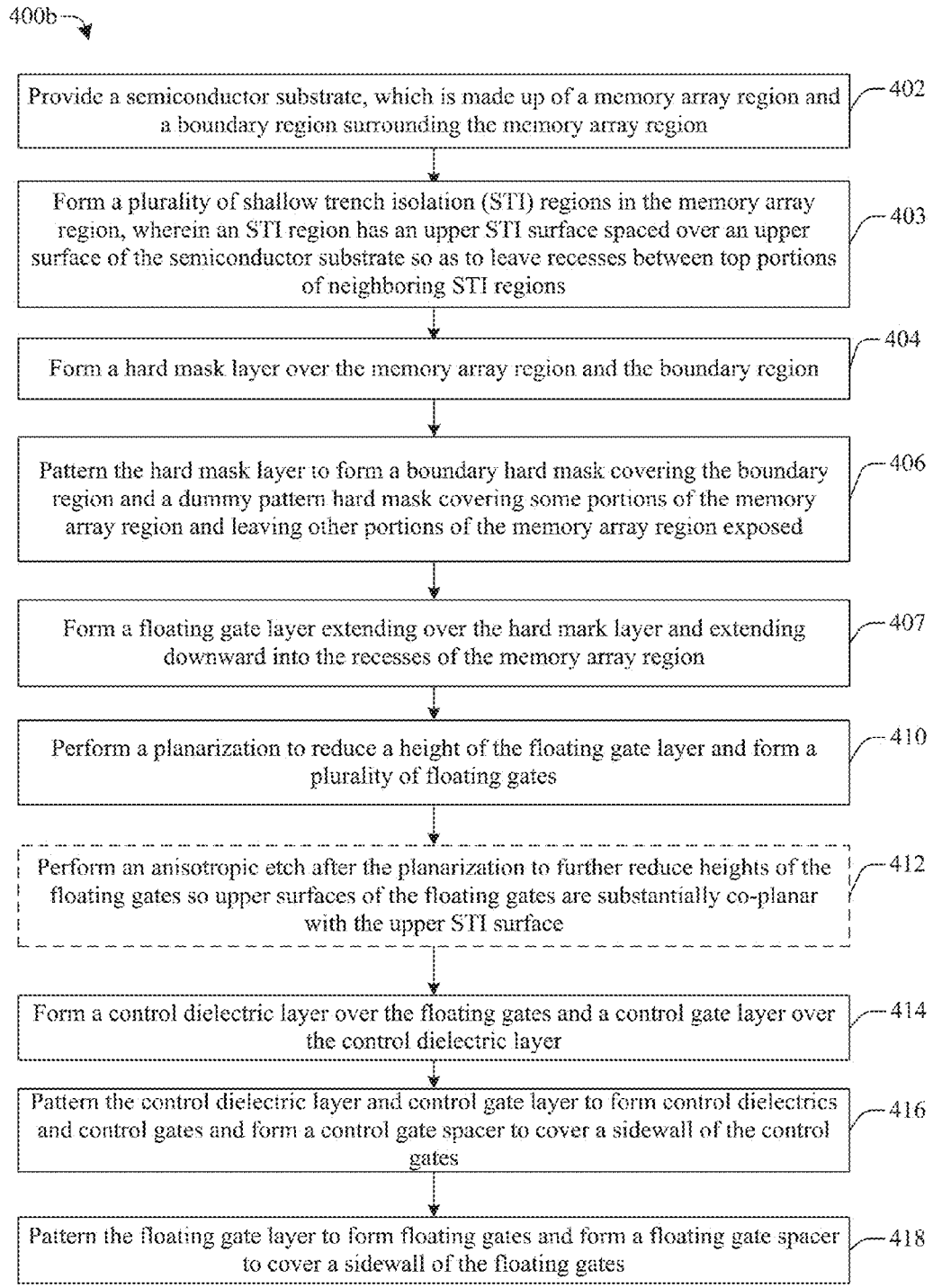
FIG. 4B illustrates a flow diagram of some other embodiments of a method of forming an integrated circuit (IC) using a dummy pattern hard mask at the memory array region.

FIG. 4B shows a flow diagram of a method 400b of forming an integrated circuit (IC) using a dummy pattern hard mask at the memory array region in accordance with some embodiments. While the disclosed method 400b is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 402, a semiconductor substrate is provided, which is made up of a memory array region and a boundary region surrounding the memory array region.

At act 403, a plurality of shallow trench isolation (STI) regions are formed in the memory array region, wherein an STI region has an upper STI surface spaced over an upper surface of the semiconductor substrate so as to leave recesses between top portions of neighboring STI regions.

At act 404, a hard mask layer is formed over the memory array region and the boundary region.

At act 406, the hard mask layer is patterned to form a boundary hard mask covering the boundary region and a dummy pattern hard mask covering some portions of the memory array region and leaving other portions of the memory array region exposed.

At act 407, a floating gate layer is formed extending over the hard mark layer and extending downward into the recesses of the memory array region.

At act 410, a planarization is performed to reduce a height of the floating gate layer and form a plurality of floating gates.

At act 412, optionally, an anisotropic etch is performed after the planarization to further reduce heights of the floating gates so upper surfaces of the floating gates are substantially co-planar with the upper STI surface.

At act 414, a control dielectric layer is formed over the floating gates and a control gate layer over the control dielectric layer.

At act 416, the control dielectric layer and control gate layer are patterned to form control dielectrics and control gates and form a control gate spacer to cover a sidewall of the control gates.

At act 418, the floating gate layer is patterned to form floating gates and a floating gate spacer is formed to cover a sidewall of the floating gates.

At act 420, erase gate, word line and contacts are formed subsequently.

FIGS. 5A-5B through 16A-16B illustrate cross-sectional views of some embodiments showing a method of forming an integrated circuit (IC) using a dummy pattern hard mask at the memory array region. Although FIGS. 5A-5B through 16A-16B are described in relation to method 400b, it will be appreciated that the structures disclosed in FIGS. 5A-5B through 16A-16B are not limited to such a method, but instead may stand alone as structures independent of the method.

Figure 5A:
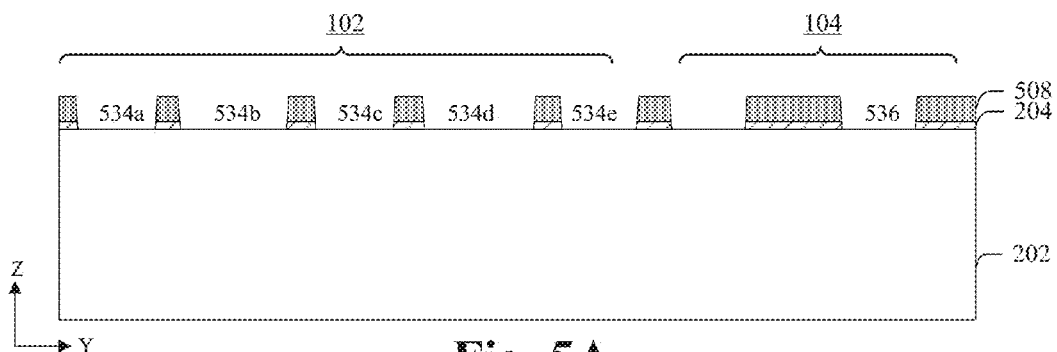
FIGS. 5A-16B illustrate cross-sectional views of some embodiments showing a method of forming an integrated circuit (IC) using a dummy pattern hard mask at the memory array region.
Figure 5B:
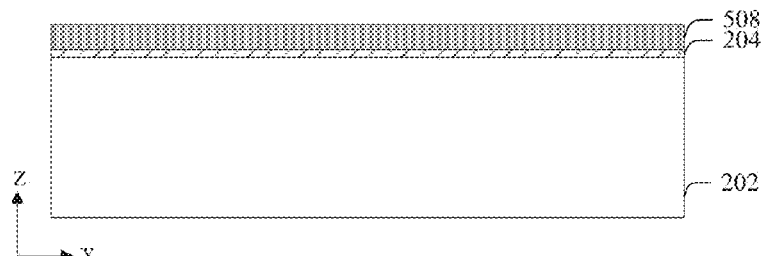
Figure 6A:
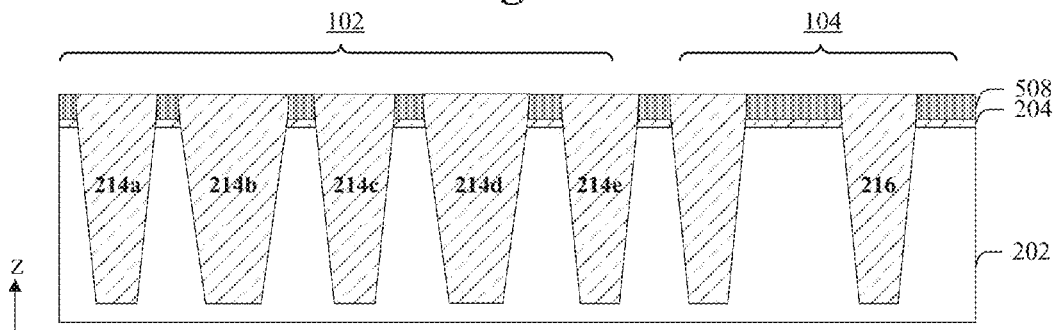
Figure 6B:
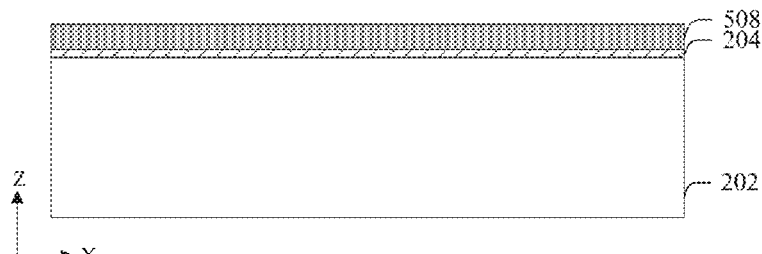

FIGS. 5A & B and FIGS. 6A & B illustrate some embodiments of cross-sectional views corresponding to act 402 and act 403. As shown by FIGS. 5A & B, a gate dielectric layer 204 and a sacrificial mask layer 508 is formed and patterned over a semiconductor substrate 202. The gate dielectric layer 204 can be an oxide, such as silicon dioxide. The sacrificial mask layer 508 is formed on the gate dielectric layer 204. The sacrificial mask layer 508 is formed and patterned so it covers diffusion regions of the semiconductor substrate 202. For example, the sacrificial mask layer 508 can be formed to expose those regions of the semiconductor substrate 202 to be employed as isolation regions, such as openings 534a, 534b, 534c . . . at a memory array region 102 and openings 536 at a boundary region 104 surrounding the memory array region 102. The sacrificial mask layer 508 is typically formed of silicon nitride, but other materials are amenable.

The semiconductor substrate 202 is typically planar with a uniform or substantially uniform thickness. Further, the semiconductor substrate 202 can be n- or p-type, and can, for example, be a handle wafer, such as a Si wafer or a silicon-on-insulator (SOI) substrate. If present, an SOI substrate is often made up of an active layer of high quality silicon, which is arranged over a handle wafer and is separated from the handle wafer by a buried oxide layer. In some other embodiments, the semiconductor substrate can also be a sapphire substrate, a binary compound substrate (e.g. a III-V substrate), or other higher order compound substrate (e.g. AlGaAs), with or without additional insulating or conducting layers formed thereover, among others.

As shown by FIGS. 6A & B, the semiconductor substrate 202 is selectively exposed to an etchant in areas not covered by the sacrificial mask layer 508. The etchant forms a first plurality of trenches at the memory array region 102 and a second plurality of trenches at the boundary region 104 extending partially into the semiconductor substrate. In some embodiments, the etchant may comprise a dry etchant. In some embodiments, the dry etchant may have an etching chemistry comprising a fluorine species (e.g., $CF_4$, $CHF_3$, $C_4F_8$, etc.). In some embodiments, the etching chemistry may further comprise oxygen or hydrogen, for example. In other embodiments, the etchant may comprise a wet etchant comprising hydroflouric acid (HF). In some embodiments, the etchant may form the pluralities of trenches by performing an anisotropic etch into the semiconductor substrate 202. Then, an insulating material is formed to fill the trenches to form a plurality of dielectric bodies 214 (e.g. 214a, 214b, 214c . . . ) at the memory array region 102, as STI regions. In some embodiments, a second plurality of dielectric bodies 216 is formed at the boundary region 104 at the same time. The insulating material can be formed by using a deposition technique (e.g., CVD, PE-CVD, PVD, etc.) to fill the pluralities of trenches and to cover the sacrificial mask layer 508 first; and then by planarizing the substrate to expose the sacrificial mask layer 508. In some embodiments, the insulating material can be an oxide, such as silicon dioxide.

Figure 7A:
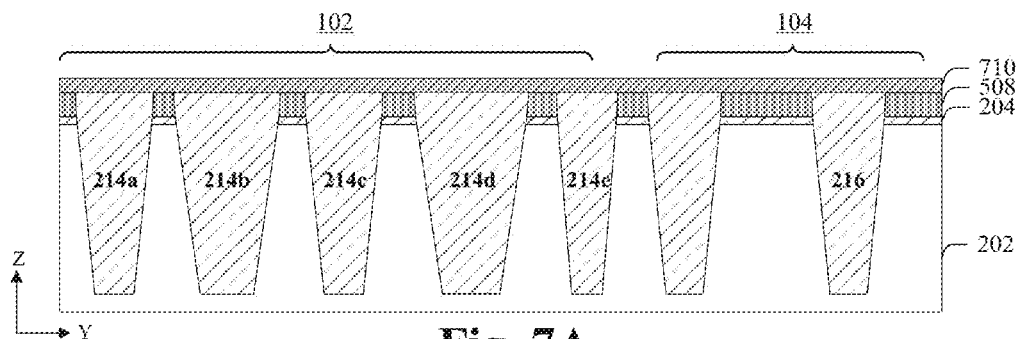
Figure 7B:
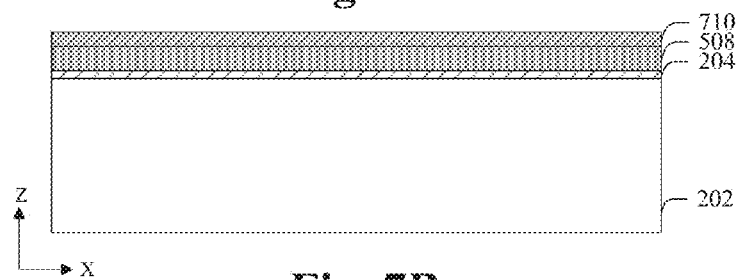

FIGS. 7A & B illustrate some embodiments of cross-sectional views corresponding to act 404. As shown, a hard mask layer 710 is formed over the sacrificial mask layer 508 and the STI regions 214. In some embodiments, the hard mask layer 710 can be an oxide, such as silicon dioxide.

Figure 8A:
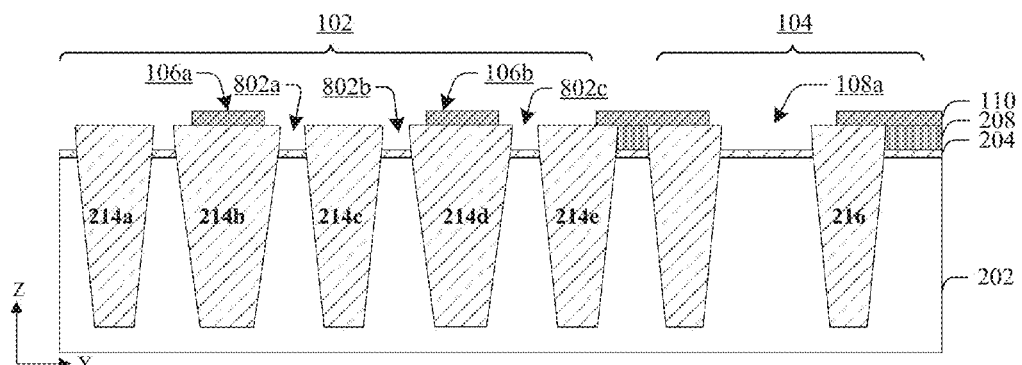
Figure 8B:
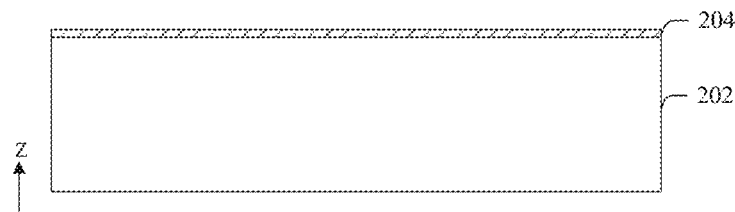

FIGS. 8A & B illustrate some embodiments of cross-sectional views corresponding to act 406. As shown, the hard mask layer 710 is patterned to form a boundary hard mask 110 covering the boundary region 104 and a dummy pattern hard mask 106 (including portions such as a first portion 106a and a second portion 106b) covering some portions of the memory array region 102 and leaving the rest portions of the memory array region 102 exposed. The dummy pattern hard mask 106 is configured to provide supports during a subsequent planarization process for the memory array region 102. In some embodiments, slots 108 (such as 108a) are formed at the boundary hard mask 110 to further provide balance for the subsequent planarization between the memory array region 102 and the boundary region 104. Exposed portions of the sacrificial mask layer 508 are removed at this act by for example, a wet etching process, to leave recesses 802 between upper portions of neighboring STI regions 214.

Figure 9A:
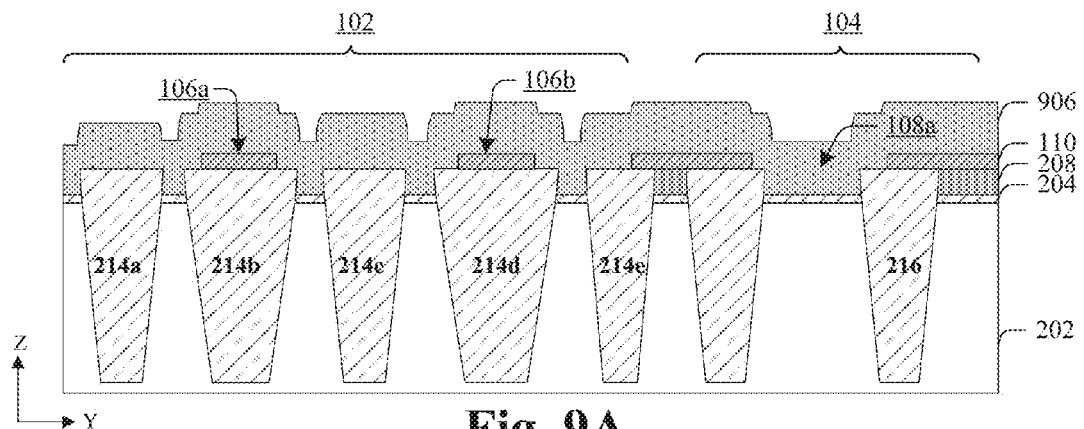
Figure 9B:

FIGS. 9A & B illustrate some embodiments of cross-sectional views corresponding to act 407. As shown, a floating gate layer 906 is formed extending over the boundary hard mark 110 and the dummy pattern hard mask 106 and extending downward into the recesses 802 of the memory array region 102. The floating gate layer 906 can be formed of polysilicon or metal and may have a maximum thickness of from about 450 Å to about 550 Å. The floating gate layer 906 can be formed by using a deposition technique (e.g., CVD, PE-CVD, PVD, etc.) to fill the recesses 802 and to cover the hard mask layer 710 remaining.

Figures 1A, 10:
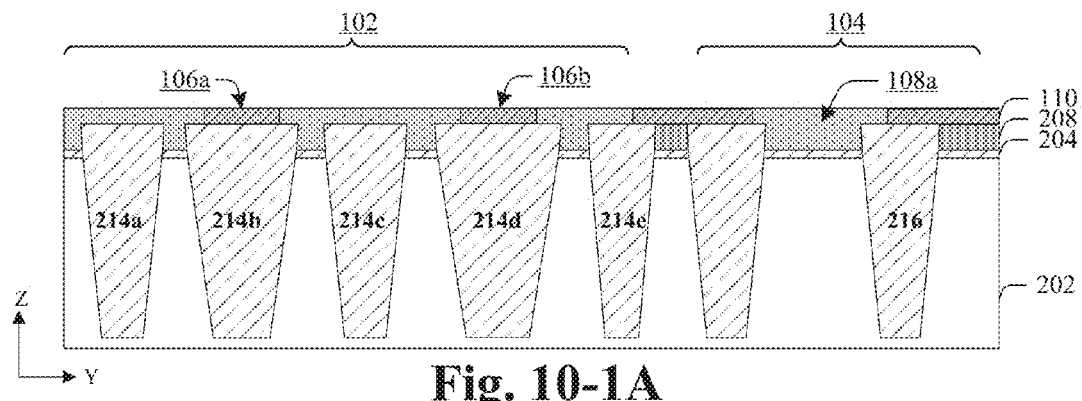
Figures 1B, 10:
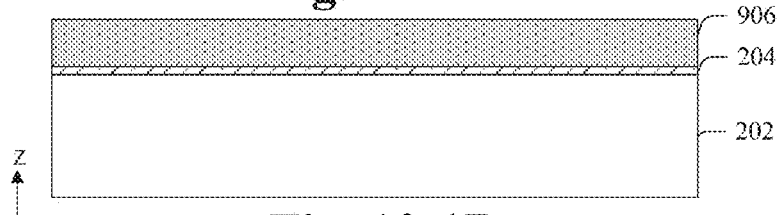

FIGS. 10-1A & B illustrate some embodiments of cross-sectional views corresponding to act 410. As shown, a planarization is performed to reduce a height of the floating gate layer 906. Remaining portions of the floating gate layer include a plurality of floating gate precursors arranged between the STI regions 214. In some embodiments, the planarization process may comprise a chemical mechanical polishing (CMP) process. During the CMP process, the dummy pattern hard mask 106 and the boundary hard mask 110 function as CMP stopping layers and the dummy pattern hard mask 106 helps to keep the remaining portion of the floating gate layer 906 being uniform. This is because the hard masks 106, 110 has a structural rigidity that is greater than that of the floating gate layer 906.

Figures 2A, 10:
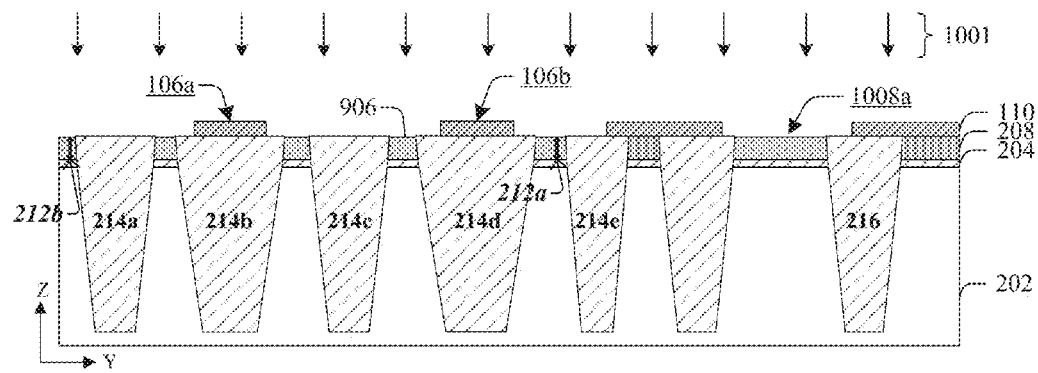
Figures 2B, 10:
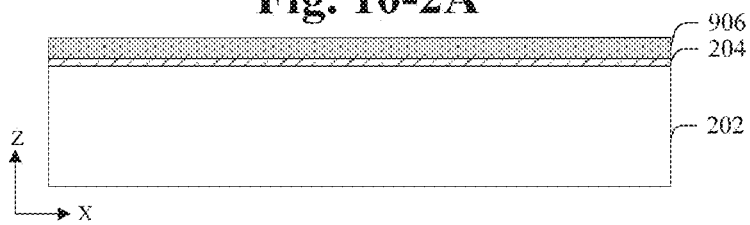

FIGS. 10-2A & B illustrate some embodiments of cross-sectional views corresponding to act 412. As shown, in some embodiments, an additional anisotropic etch may be performed to further reduce heights of the floating gate layer 906 to a position that is lower than an upper surface of the remaining hard mask layer 710 (i.e. the boundary hard mask 110 and the dummy pattern hard mask 106). An upper surface of the floating gate layer 906 may be substantially co-planar with an upper surface of the STI regions 214. In some other embodiments, the floating gate layer 906 is lowered to the desired position directly by the CMP process. The floating gate layer 906 after CMP and optional etching has a relatively uniform thickness from a center to an edge of the memory array region 102. For example, a first thickness 212a that is closer to the memory array edge is substantially equal to a second thickness 212b that is closer to the center of the memory array region 102 (while the first thickness 212a may be greater than the second thickness 212b in the previous approaches because of planarization non-uniformity without dummy pattern hard mask 106).

Figure 11A:
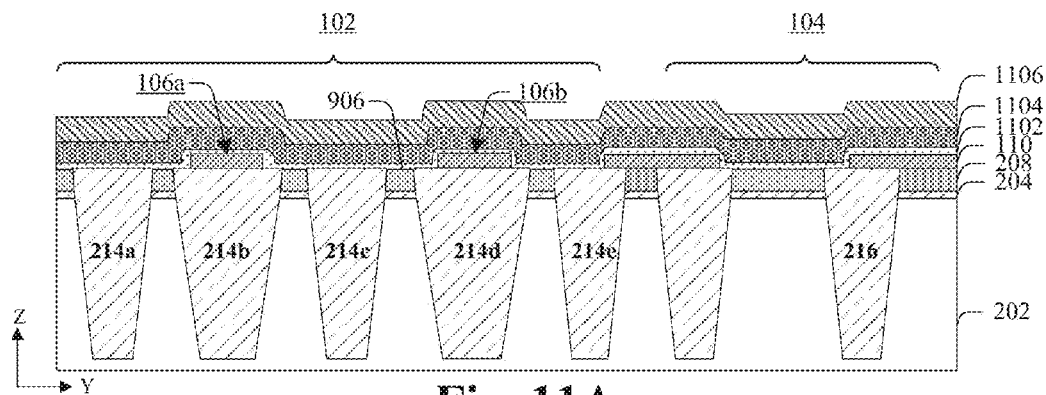
Figure 11B:
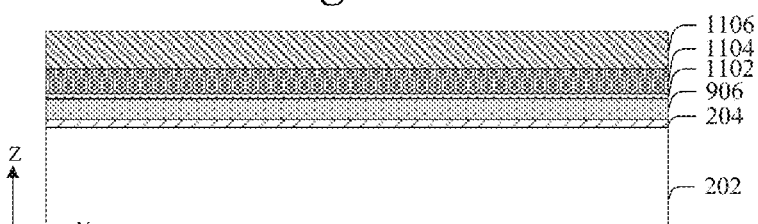

FIGS. 11A & B illustrate some embodiments of cross-sectional views corresponding to act 414. As shown, a control dielectric layer 1102, a control gate layer 1104 and an optional mask layer 1106 are formed over the floating gate layer 906 and cover the remaining hard mask layer 710. The control dielectric layer 1102 is typically an ONO dielectric and conforms to the floating gate layer 906 and the remaining hard mask layer 710. The control gate layer 1104 is typically polysilicon.

Figure 12A:
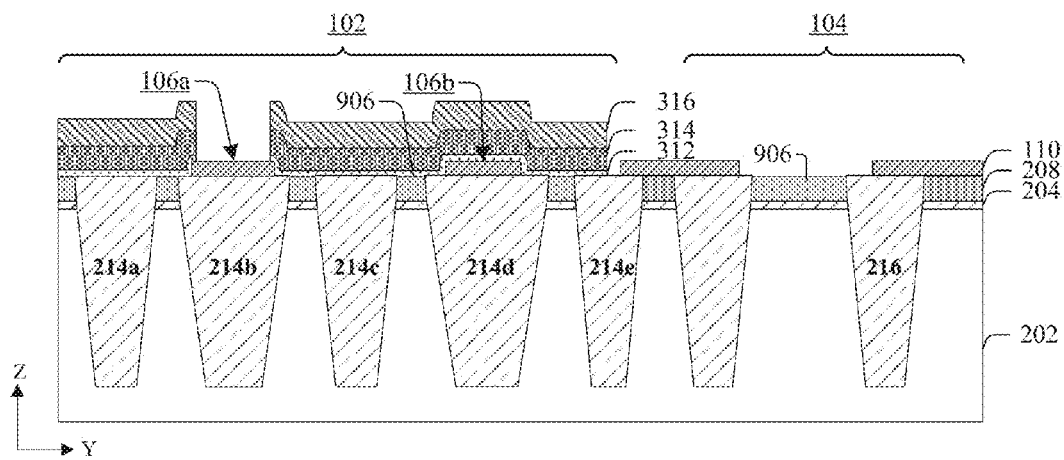
Figure 12B:
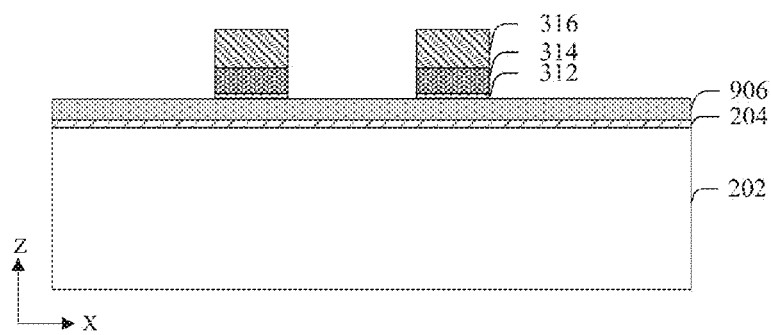
Figure 13A:
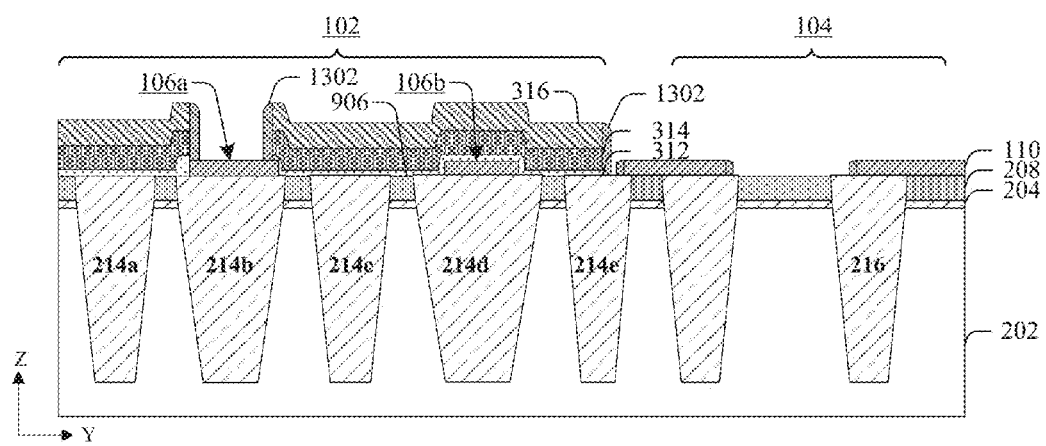
Figure 13B:
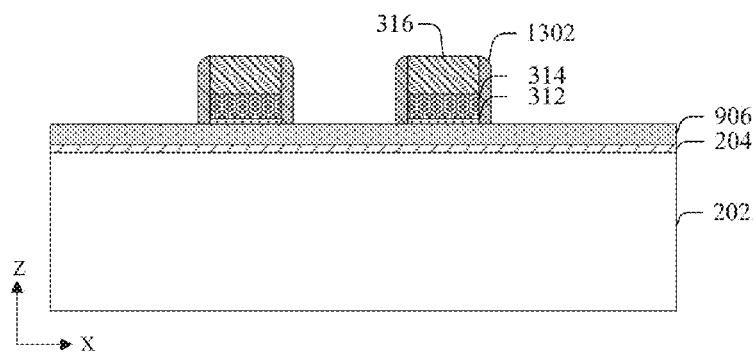

FIGS. 12A & B and FIGS. 13A & B illustrate some embodiments of cross-sectional views corresponding to act 416. As shown in FIGS. 12A & B, the control dielectric layer 1102, the control gate layer 1104, and the optional mask layer 1106 are patterned and removed outside the memory array region 102, such as removed from the boundary region 104. The control dielectric layer 1102 and the control gate layer 1104 are also patterned to respectively form control dielectric layers 312 and control gates 314 for memory cells. In various embodiments, patterning may be performed using one or more etchants such as a dry etchant (e.g., an RIE etch, a plasma etch, etc.) or a wet etchant (e.g., hydroflouric acid, phosphoric acid, etc.). As shown in FIGS. 13A & B, a control gate spacer 1302 is formed along exposed sidewalls of the workpiece, to cover a sidewall of the control gates 314. In some embodiments, the control gate spacer 1302 can be formed to stop on the first portion 106*a* of the dummy pattern hard mask.

Figure 14A:
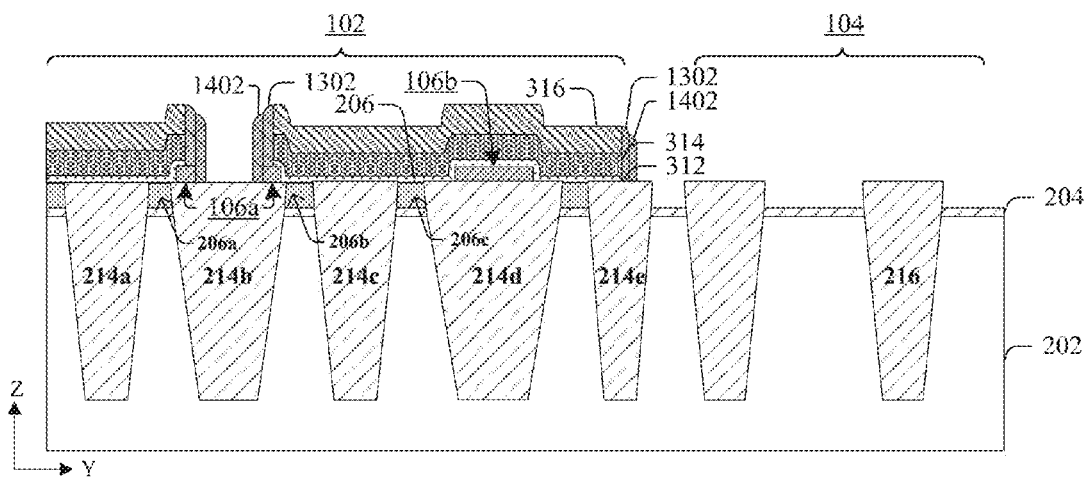
Figure 14B:
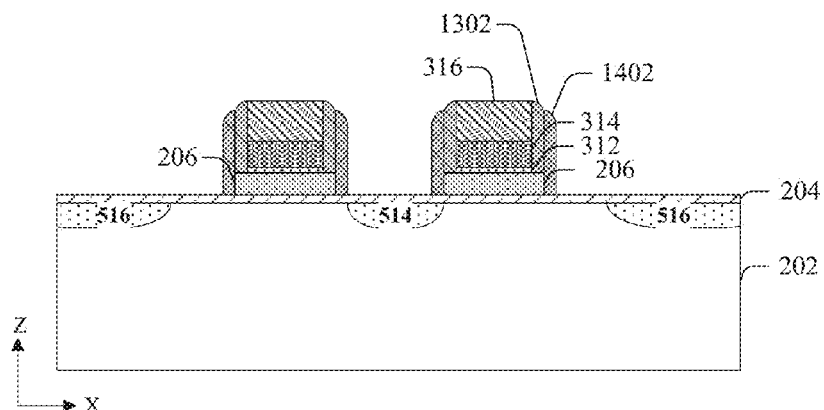

FIGS. 14A & B illustrate some embodiments of cross-sectional views corresponding to act 418. As shown, the floating gate layer 906 are patterned and removed outside the memory array region 102, such as removed from the boundary region 104. The floating gate layer 906 is also patterned to respectively form floating gates 206 (e.g. 206*a*, 206*b*, 206*c*) for memory cells. In various embodiments, patterning may be performed using one or more etchants such as a dry etchant (e.g., an RIE etch, a plasma etch, etc.) or a wet etchant (e.g., hydroflouric acid, phosphoric acid, etc.). A floating gate spacer 1402 is formed along exposed sidewalls of the workpiece, to cover a sidewall of the floating gates 206. In some embodiments, the floating gate spacer 1402 can be formed to cover an outer sidewall of the first portion 106*a* of the dummy pattern hard mask.

Figure 15A:
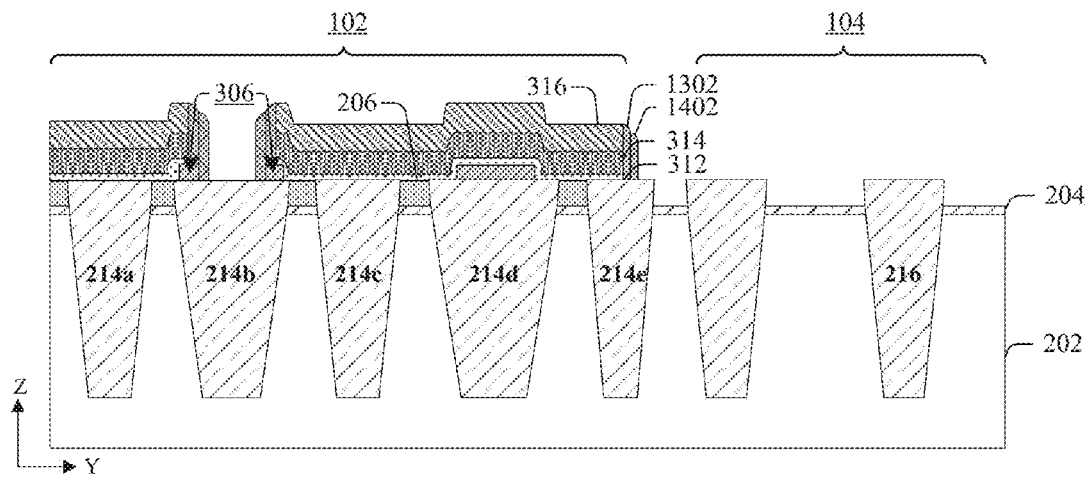
Figure 15B:
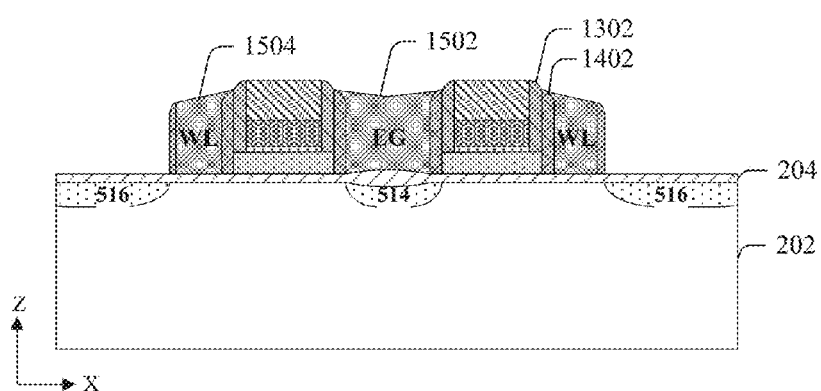
Figure 16A:
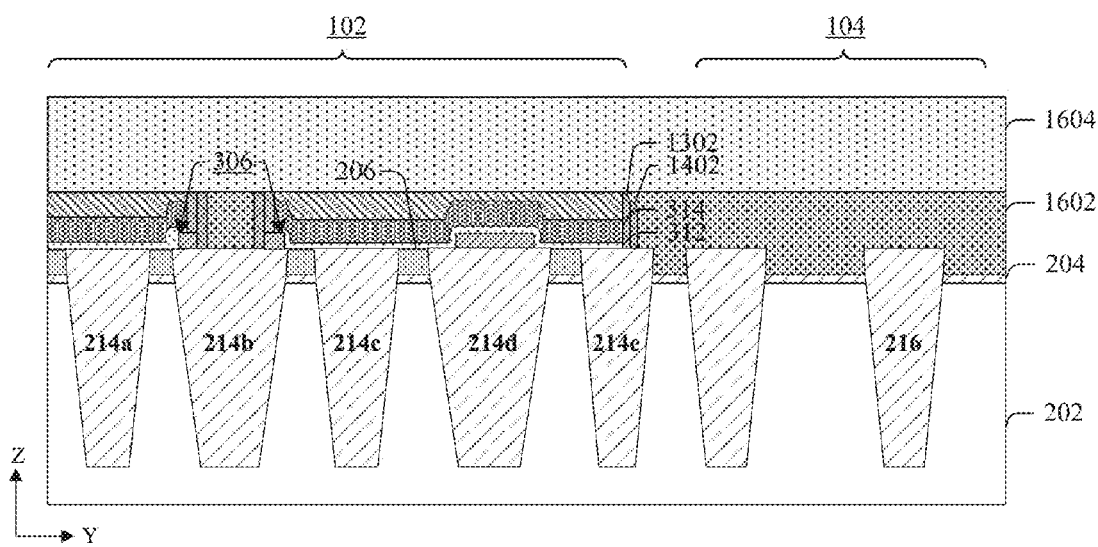
Figure 16B:
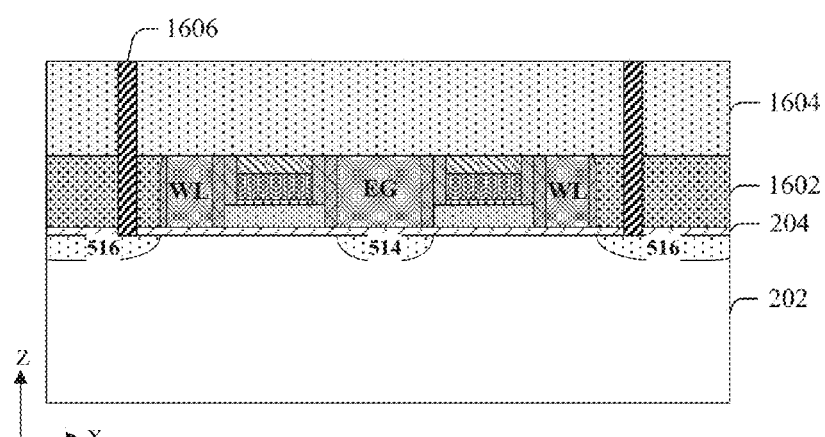

FIGS. 15A & B and FIGS. 16A & B illustrate some embodiments of cross-sectional views corresponding to act 420. As shown, erase gate 1502, word lines 1504 and contacts 1606 are formed subsequently within some inter-metal dielectric (IMD) layers 1602, 1604. The IMD layers 1602, 1604 may be deposited by way of a vapor deposition process and may comprise a low-k dielectric layer or an ultra low-k (ULK) dielectric layer, for example.

Figure 17:
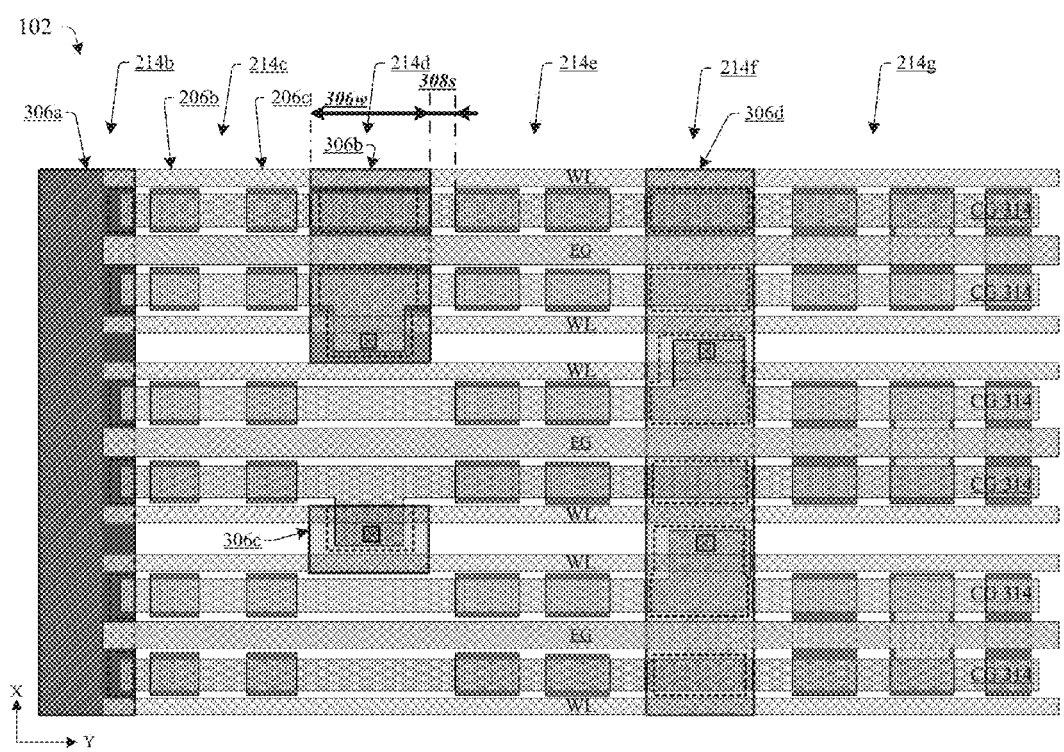
FIG. 17 illustrates a layout of some embodiments of a memory array region of an integrated circuit (IC) with a dummy pattern hard mask.

FIG. 17 illustrates a layout of some embodiments of a memory array region 102 of an integrated circuit (IC) with a dummy pattern hard mask 306. As shown, is some embodiments, the dummy pattern hard mask 306 is disposed directly above STI regions 214 which provide isolation for floating gates 206. The dummy pattern hard mask 306 can be disposed on selected STI regions (e.g. STI regions 214*b*, 214*d*, 214*f*) that have a sufficient area, for example, in current process node, dimensions are greater than about 200 nm, but scaling for different process nodes is amenable. The dummy pattern hard mask 306 may comprise discrete portions such as 306*a*, 306*b*, 306*c* and 306*d* as shown. The dummy pattern hard mask 306 is disposed under a control gate layer. The dummy pattern hard mask 306 can be spaced apart from edges of the STI regions 214, for example, having a distance 308*s* greater than 65 nm. The dummy pattern hard mask 306 can have a dimension 306*w* greater than 100 nm. The dummy pattern hard mask 306 can be fully or partially removed after planarization. In some embodiments, a partial of the dummy pattern hard mask 306 disposed directly under the control gate layer 314 shown by dash-lines can be left within the final device.

Although various embodiments have been illustrated with regards to floating gate flash memory cells, it will be appreciated that the present disclosure is also applicable to various types of non-volatile memory (NVM) devices. For example, flash memory cell devices include silicon-oxide-nitride-oxide-silicon (SONOS) split gate flash memory cell devices, metal-oxide-nitride-oxide-silicon (MONOS) split gate flash memory cell devices, and third generation SUPERFLASH (ESF3) memory cell devices. Another type of flash memory that is contemplated as falling within the scope of this disclosure is stacked gate flash memory cell. Concepts of the present disclosure are applicable to a wide range of flash memory and are not limited to the given examples.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

Accordingly, the present disclosure relates to a structure and method for forming an integrated circuit having a dummy pattern hard mask disposed at the memory array region under a control gate layer to help forming a plurality of floating gates with a substantially uniform thickness. The formation of the dummy pattern hard mask provides a sufficient support and etch stopping when planarizing a conductive layer to form memory gates of the memory device and further help provide uniform planarization.

In some embodiment, the present disclosure relates to a method of forming an integrated circuit (IC) for an embedded flash memory device. In some embodiments, a semiconductor substrate is provided and made up of a memory array region and a boundary region surrounding the memory array region. A hard mask layer is formed over the memory array region and the boundary region. The hard mask layer is patterned to form a boundary hard mask having one or more slots to expose some portions of the boundary region while the remaining regions of the boundary region are covered by the boundary hard mask. A floating gate layer is formed within the memory array region and extending over the hard mask layer. Then, a planarization is performed to reduce a height of the floating gate layer and form a plurality of floating gates.

In another embodiment, the present disclosure relates to a method of forming an integrated circuit (IC) for an embedded flash memory device. A semiconductor substrate is provided and made up of a memory array region and a boundary region surrounding the memory array region. A plurality of shallow trench isolation (STI) regions are formed within the semiconductor substrate so as to define recesses between upper portions of neighboring STI regions. A hard mask is then formed on the plurality of STI region regions. A plurality of floating gates is then formed filling the recesses between neighboring STI regions within the memory array region. A control gate layer is formed over an upper surface of the floating gates and stepping upwards to extend over an edge of the hard mask over the STI regions.

In yet another embodiment, the present disclosure relates to a method of forming an integrated circuit (IC) for an embedded flash memory device. A semiconductor substrate is provided and made up of a memory array region and a boundary region surrounding the memory array region. A hard mask layer is formed over the memory array region and the boundary region. The hard mask layer is patterned to form a boundary hard mask covering the boundary region and a dummy pattern hard mask covering some portions of the memory array region and leaving other portions of the memory array region exposed. A floating gate layer is formed extending over the hard mask layer and extending downward into the exposed portions of the memory array region. A planarization is performed to reduce a height of the floating gate layer and form a plurality of floating gates having a substantially uniform thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an integrated circuit (IC), comprising:
   providing a semiconductor substrate, which is made up of a memory array region and a boundary region surrounding the memory array region;
   forming a hard mask layer over the memory array region and the boundary region;
   patterning the hard mask layer to form a boundary hard mask having one or more slots to expose some portions of the boundary region while covering the remaining regions of the boundary region and to form a dummy pattern hard mask covering some portions of the memory array region and exposing other portions of the memory array region;
   forming a floating gate layer within the memory array region and extending over the dummy pattern hard mask; and
   performing a planarization to reduce a height of the floating gate layer and form a plurality of floating gates.

2. The method of claim 1, wherein the floating gate layer extends downward into the exposed portions of the memory array region.

3. The method of claim 1, further comprising:
   forming a control gate layer over the floating gate layer;
   forming a control gate spacer along a sidewall of the control gate layer; and
   forming a floating gate spacer along a sidewall of the control gate spacer, and extending downward to cover a sidewall of the dummy pattern hard mask.

4. The method of claim 1, further comprising:
   prior to forming the hard mask layer, forming a plurality of shallow trench isolation (STI) regions within the semiconductor substrate so as to define recesses between upper portions of neighboring STI regions;
   wherein the boundary hard mask and the dummy pattern hard mask are formed directly on the STI regions.

5. The method of claim 1, further comprising:
   forming a control dielectric layer within the memory array region directly on the floating gate layer and the dummy pattern hard mask.

6. The method of claim 1, further comprising:
   performing a planarization to reduce a height of the floating gate layer to a substantially uniform thickness.

7. The method of claim 6, wherein the floating gate layer is further lowered to form a plurality of floating gates having a top surface lower than a top surface of the boundary hard mask.

8. The method of claim 1, wherein the hard mask layer is made of dielectric material.

9. A method for manufacturing an integrated circuit (IC), comprising:
   providing a semiconductor substrate made up of a memory array region and a boundary region surrounding the memory array region;
   forming a plurality of shallow trench isolation (STI) regions within the semiconductor substrate so as to define recesses between upper portions of neighboring STI regions;
   forming a hard mask layer over the STI regions;
   patterning the hard mask layer to leave portions corresponding to the hard mask in place and to remove remaining portions within the memory region and some slot portions of the hard mask layer within the boundary region;
   forming a plurality of floating gates filling the recesses between neighboring STI regions within the memory array region; and
   forming a control gate layer over an upper surface of the floating gates and stepping upwards to extend over an edge of the hard mask over the STI regions.

10. The method of claim 9, further comprising forming and patterning a sacrificial mask layer prior to forming the STI regions so as to expose regions of the semiconductor substrate to be employed as the STI regions.

11. The method of claim 9, further comprising forming a control gate spacer along a sidewall of the control gate layer and having a lower surface that abuts an upper surface of the hard mask.

12. The method of claim 11, further comprising forming a floating gate spacer along the sidewall of the control gate spacer, and extending downward to cover the sidewall of the hard mask.

13. The method of claim 9, wherein an upper surface of a floating gate is horizontally lower than that of the hard mask.

14. The method of claim 9, wherein the hard mask comprises silicon dioxide or silicon nitride.

15. The method of claim 9, further comprising:
   forming a control dielectric layer within the memory array region between the floating gates and the control gate layer prior to forming the control gate layer;
   wherein the hard mask is formed under the control dielectric layer.

16. The method of claim 9, wherein the hard mask is formed as discrete portions correspondingly disposed directly on the plurality of STI regions.

17. A method for manufacturing an integrated circuit, comprising:
   providing a semiconductor substrate, which is made up of a memory array region and a boundary region surrounding the memory array region;
   forming a plurality of shallow trench isolation (STI) regions in the memory array region and the boundary region;
   forming a hard mask layer on the plurality of STI regions over the memory array region and the boundary region;
   patterning the hard mask layer to form a boundary hard mask covering some portions of the boundary region while leaving other portions of the boundary region exposed and to form a dummy pattern hard mask covering some portions of the memory array region and leaving other portions of the memory array region exposed;

forming a floating gate layer extending over the hard mask layer and extending downward into exposed portions of the memory array region; and performing a planarization to reduce a height of the floating gate layer and form a plurality of floating gates having a substantially uniform thickness.

18. The method of claim 17, further comprising:

wherein an STI region has an upper STI surface spaced over an upper surface of the semiconductor substrate so as to leave recesses between top portions of neighboring STI regions;

wherein the dummy pattern hard mask is disposed directly above an STI region and wherein the recesses are not covered by the patterned hard mask layer so the floating gate layer extends downward in the recesses.

19. The method of claim 17, further comprising:

when patterning the hard mask layer, patterning one or more slots within the boundary hard mask, exposing some portions of the boundary region.

20. A method for manufacturing an integrated circuit (IC), comprising:

providing a semiconductor substrate made up of a memory array region and a boundary region surrounding the memory array region;

forming a plurality of shallow trench isolation (STI) regions within the semiconductor substrate so as to define recesses between upper portions of neighboring STI regions;

forming a hard mask over the plurality of STI regions;

forming a plurality of floating gates filling the recesses between neighboring STI regions within the memory array region;

forming a control gate layer over an upper surface of the floating gates and stepping upwards to extend over an edge of the hard mask over the STI regions; and forming a control gate spacer along a sidewall of the control gate layer and having a lower surface that abuts an upper surface of the hard mask.

* * * * *